United States Patent [19]

Nadeau

[11] Patent Number: 4,992,729
[45] Date of Patent: Feb. 12, 1991

[54] LOW PROFILE INKER

[75] Inventor: Normand Nadeau, Granby, Canada

[73] Assignee: Mitel Corporation, Ontario, Canada

[21] Appl. No.: 348,503

[22] Filed: May 8, 1989

[30] Foreign Application Priority Data

Jun. 24, 1988 [CA] Canada .................................. 570329

[51] Int. Cl.⁵ ...................... G01R 31/02; G01D 15/16
[52] U.S. Cl. .............................. 324/158 P; 346/140 A; 346/141
[58] Field of Search ......................... 324/158 P, 158 F; 346/140 R, 140 A, 141, 33 F, 139 C

[56] References Cited

U.S. PATENT DOCUMENTS

| | | | |
|---|---|---|---|
| 3,125,401 | 3/1964 | Boone | 346/140 A |
| 3,686,681 | 8/1972 | Stegenga | 346/141 |

FOREIGN PATENT DOCUMENTS 0207143  8/1988  Japan .............................. 324/158 P

*Primary Examiner*—Ernest F. Karlsen
*Attorney, Agent, or Firm*—Antonelli, Terry, Stout & Kraus

[57] ABSTRACT

A low profile inker for use in a semiconductor testing apparatus. A probe test head of the apparatus detects defective circuits on a semiconductor wafer and generates control signals in response thereto. The inker is connected to the testing apparatus by means of a support arm beneath the probe test head. An inker reservoir is connected to the support arm and has a substantially vertical needle extending therefrom with a tip thereof proximate the semiconductor wafer circuit under test. A solenoid activated plunger arm is connected to the support arm in parallel with the reservoir and an angle pin connects the plunger to an inker filament disposed within the reservoir. The angle pin converts vertical movement of the solenoid operated plunger into parallel movement of the inker filament within the reservoir for forcing liquid onto the semiconductor wafer in order to mark defective circuits.

12 Claims, 3 Drawing Sheets

LOW PROFILE INKER

This invention relates in general to marking devices, and more particularly to a low profile inker for use within a semiconductor wafer testing instrument.

In the manufacture of integrated circuit chip wafers, there is a requirement for marking defective circuits before the wafer is diced to provide individual chips. Prior art marking devices have been developed for ejecting drops of magnetic ink on defective circuits of a wafer under test.

Examples of conventional prior art inker systems can be found with reference to the U.S. Pat. Nos. 3,943,527 (Hartmann), 3,345,567 (Turner et al), 3,185,927 (Margulis et al), 3,572,400 (Casner et al) and 3,087,248 (Martin).

The conventional inkers of Turner et al, Margulis et al and Martin incorporate mechanical apparatus for moving an inking element such as a pen or fibrous wick into contact with the defective circuit for marking the wafer. A disadvantage of such mechanical systems is that physical contact between the inker and wafer circuits may result in advertent damage of the wafer.

The prior art apparatus disclosed in the Hartmann patent utilizes a "spritzer-type" inker in which magnetic ink is forced onto a defective circuit through a needle by means of a solenoid activated plunger connected on top of and in line with a reservoir for storing magnetic ink.

A disadvantage of prior art inkers such as Hartmann is that the height of such inkers typically interferes with passage of the probe test head which is disposed above the inker. The height of the inker is a direct result of the in-line connection of the solenoid activated plunger to the reservoir filament and the resulting linear axis movement effected therebetween. In other words, the overall length of the inker from the tip of the needle to the top of the plunger is typically in the vicinity of 8 centimeters, with the top-most portion of the plunger interferring with movement of the probe test head.

Thus, in order to move the test head according to prior art inkers such as Hartmann, the inker is required to be manually moved. Movement of the inker may result in a number of disadvantages such as high risk of probe card damage, difficult handling of the inker from the undersurface of the probe test head, and unsteady installation of the inker. Furthermore, it has been found that excess time is required to move the inker in order to install a new socket adaptor for testing.

There has been an industry bias towards in-line connection of the solenoid plunger and inker reservoir for the principle reason that linear axis movement of the solenoid plunger and inker filament is inherently easy to adjust for eliminating binding of the inker filament within the reservoir in the event of off-axis inclination of the plunger arm and inker filament.

In an effort to overcome the excess height disadvantage of prior art in-line inkers such as Hartmann, some manufacturers have produced in-line solenoid plunger actuated inkers which are connected to the testing apparatus at an oblique angle, and utilize a curved inker needle extending from the reservoir to the wafer under test at an angle of approximately 80°. An example of such a prior art inker system is the model B-100-LTX inker manufactured by Xandex of Petaluma, Calif. A significant disadvantage of prior art inkers utilizing curved inker needles is that the advantage of gravity feed is lost over the vertically oriented in-line systems, which places much greater reliance on relatively low efficiency capillary action within the inker.

According to the present invention, an inker is provided wherein the solenoid actuated plunger is disposed in parallel with the ink reservoir on a main support arm and is connected to the inker filament by means of a parallel activator or angle pin. The parallel activator translates vertical movement of the solenoid plunger into parallel movement of the inker filament for forcing liquid from the reservoir onto the semiconductor wafer under test. By positioning the solenoid plunger beside and in parallel with a reservoir, the overall height of the inker is reduced substantially (e.g. typically on the order of 2.5 centimeters) thereby removing the traditional obstruction to passage of the probe test head as exemplified by the above discussed prior art.

In general, according to the present invention, there is provided a low profile inker for use in a probe instrument provided with a movable probe test head for testing circuits on a semiconductor wafer and in response generating control signals indicative of defective ones of the circuits. The inker is comprised of a support arm connected to the probe instrument beneath the test head; an inker reservoir mounted on the support arm for storing a quantity of marking liquid, including a substantially vertical inker filament for forcing the liquid from the reservoir; a solenoid operated plunger mounted on the support arm parallel to the reservoir, for receiving the control signals and in response moving in a substantially vertical axis; a needle extending substantially vertically downward from the reservoir for directing the liquid forced from the reservoir onto the defective circuits; and a parallel activator connecting the plunger and the inker filament for translating vertical movement of the plunger into parallel movement of the inker filament thereby forcing the liquid onto the defective circuits, whereby parallel mounting of the plunger and reservoir on the support arm contributes to a low overall height of the inker sufficient to allow free passage of the movable test head over the inker.

A better understanding of the present invention will be obtained with reference to the detailed description below in conjunction with the following drawings, in which.

Figure 1:
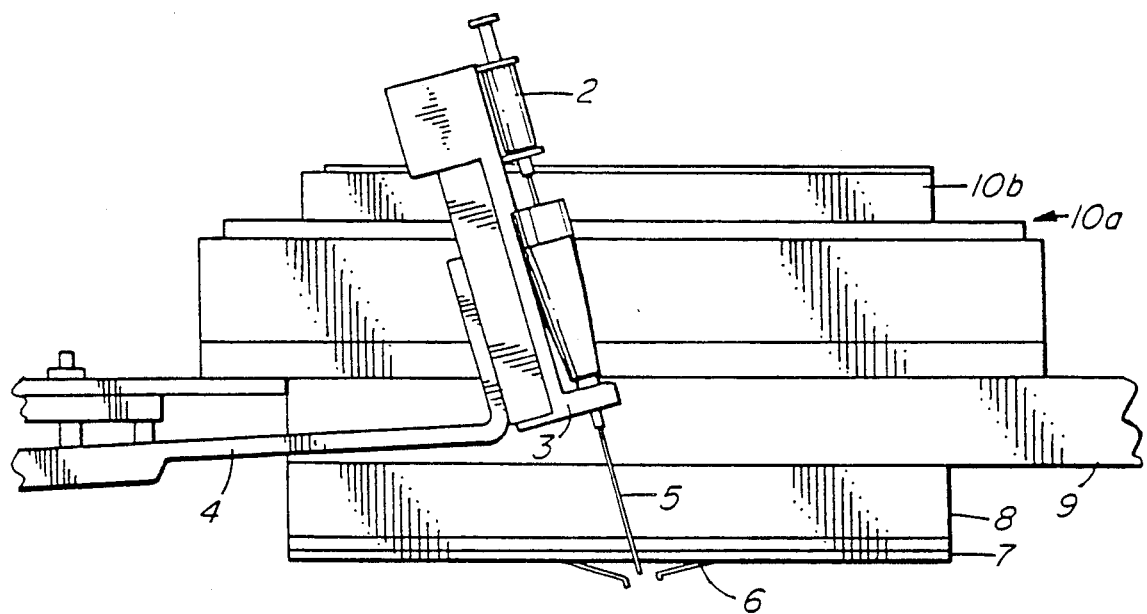
FIG. 1 is a side view of a prior art inker for use in a semiconductor testing instrument.

Turning to FIG. 1, a prior art inker is shown comprised of a reservoir 1 for storing marking liquid such as magnetic ink, and a solenoid activated plunger 2 mounted in line with the reservoir 1, the reservoir and plunger both being mounted on a main support 3. The inker is connected via an additional support 4 to the main body of the semiconductor testing instrument, otherwise known as a prober.

The testing instrument is typically any of a number of well known semiconductor testers such as those manufactured by LTX, Fairchild or Megatest, etc. The testing instrument is further comprised typically of a chuck for holding a wafer under test (not shown) disposed directly beneath the tip of a needle 5 extending from the reservoir 1 of the inker. One or more probes 6 assembled on a probe card 7 contact the wafer circuit under test for detecting defects, etc, by applying predetermined control test signals thereto. A ring adapter 8 houses the probe card 7 and is attached to a plate 9 which in turn is connected to portions of the interfacing instrument denoted as the ring 10a, and the fuzz button ring 10b.

The probe test head typically contains microprocessor intelligence for generating test current to the probe leads 6 through the rings (i.e. fuzz button ring 10b) which includes usually 60 metal spring pin conductors. The wafer is supported beneath the probes 6 on the chuck (not shown) and moved into various positions under control of the testing instrument which also generates signals for energizing the inker solenoid 2, in a well known manner. The operation of the probe test head in conjunction with the inker is described in detail with reference to the aforementioned U.S. patent of Hartmann.

As shown in FIG. 1, the in-line arrangement of solenoid plunger 2 with inker reservoir 1 results in an obstruction to passage of the test head over the fuzz button ring 10b.

Figure 2:
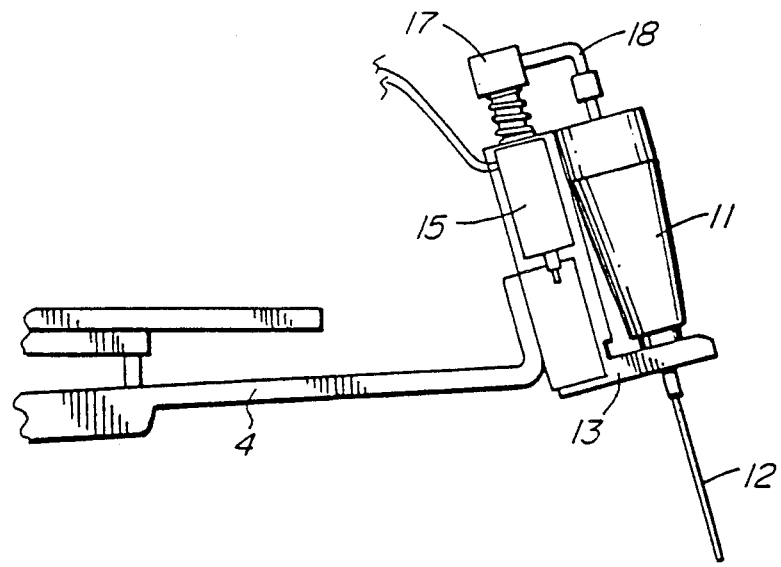
FIG. 2 is a side view of an inker in accordance with the present invention.
Figure 3:
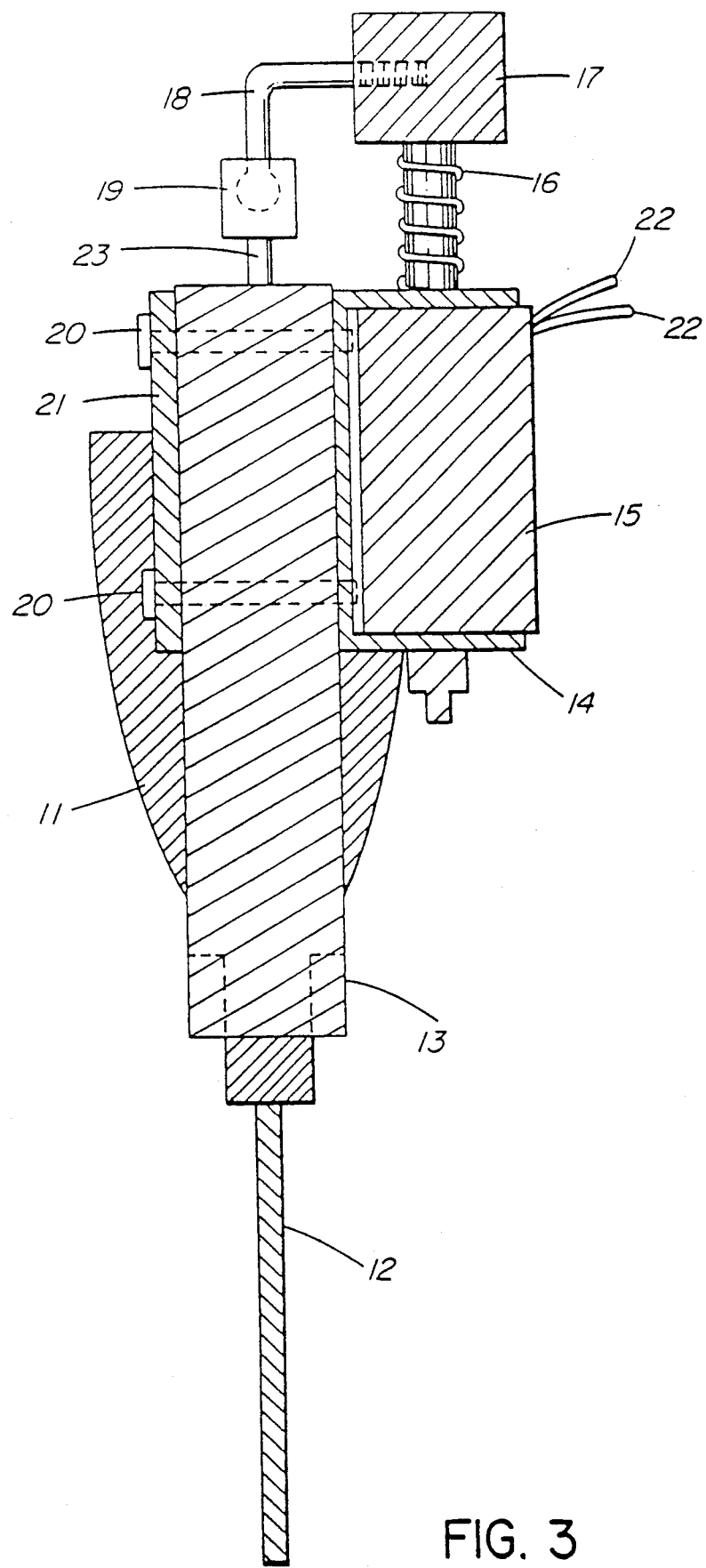
FIG. 3 is a detailed side view of the inker in accordance with a preferred embodiment of the present invention.
Figure 4:
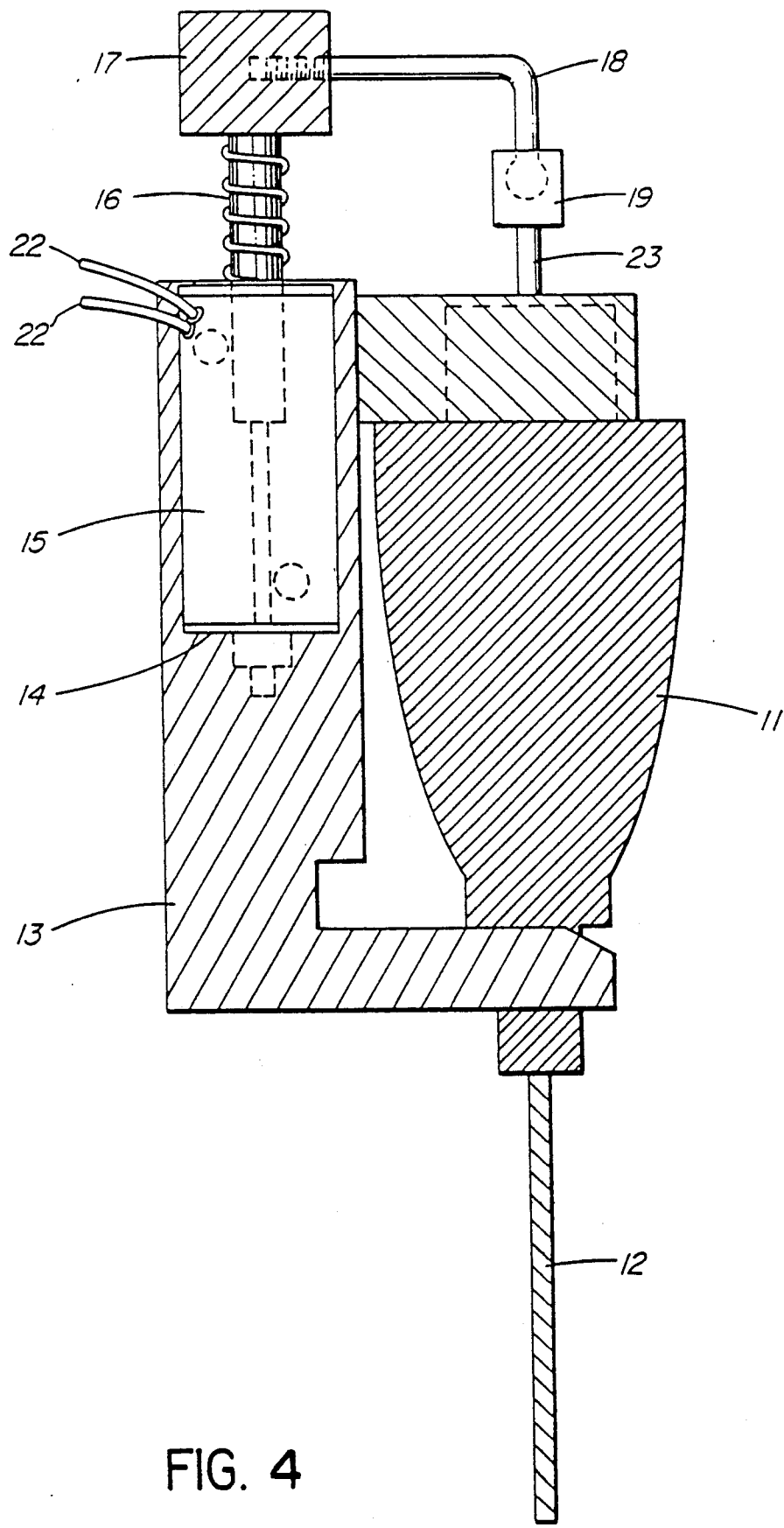
FIG. 4 is a front view of the inker shown in FIG. 3.

Turning to FIGS. 2-4, an inker is shown constructed in accordance with the present invention comprised of a reservoir 11 mounted on a main support 13 in parallel with a solenoid 15 housing a plunger arm 17. A parallel activator 18 is threaded into plunger arm 17 for connecting the plunger arm to an inker filament within the reservoir 11.

According to the present invention, the solenoid 15 is installed in parallel with the inker reservoir 11 instead of being on the same axis as in the prior art system of FIG. 1. In the successful prototype of the present invention, parallel disposition of the solenoid with respect to the reservoir resulted in a decrease in overall height of the inker by 2.5 centimeters, which was found to be sufficient for allowing passage of the test head over the fuzz button ring 10b of the testing instrument.

According to the prior art inker of FIG. 1, the support 3 was characterized by a total length or height of approximately 5 centimeters which was reduced according to the successful prototype of the present invention as illustrated in FIG. 2, to a length of 3 centimeters, for facilitating passage of the test head over the fuzz button ring.

As shown with reference to FIG. 3, a bracket 14 is shown connected to main support 13 for supporting the solenoid 15 using two metal bolts 20 inserted through the support 13 and end plate 21. The plate 21 also serves as a support for the attachment 4 (FIG. 2) holding the main support 13 to the test instrument.

The parallel activator 18 is preferably in the form of an angle pin of approximately 10 millimeters in length which is screwed into the solenoid plunger 17.

In operation, the test instrument generates a control signal carried by solenoid leads 22, for energizing solenoid 15 which in turn causes plunger 17 to be pulled within the solenoid against the force of coiled spring 16. The parallel activator or angle pin 18 translates vertical movement of the plunger 17 within solenoid 15 into parallel movement of the inker filament within reservoir 11. This effectively forces the marking liquid from the reservoir 11 via needle 12 onto the semiconductor wafer circuit under test.

The needle 12 and activator 23 form part of the reservoir 11. The activator is preferably a plastic pin attached to a plastic inker filament (not shown) within the reservoir. The activator 23 is attached to the metal angle pin 18 by means of a ball and socket joint 19, wherein the angle pin 18 has a filed head forming a bulbous portion.

The concept of parallel activation of the inker filament by means of angle pin 18 is believed to be a significant departure from the axial activation of prior art systems such as shown in FIG. 1.

One of the industry biases towards axial activation of the inker filament, and away from the parallel activation of the present invention, is that the probe or test instrument attachment 4 is required to be securely connected to main support 3 (FIG. 1). The attachment of the support 4 to the main support 3 in prior art systems was characterized by a required length of typically 33 millimeters for securely holding the inker to the support 4.

According to the present invention, the metal plate 21 serves as a support for the attachment 4 and the solenoid 15, such that the overall length of the attachment 4 may be reduced to approximately 12 millimeters.

As discussed above, the angle pin 18 must be adjusted to a correct length within the plunger 17 in order that movement of the activator is directly in line with the center axis of the reservoir 1 in order for preventing the activator from binding and becoming stuck within the reservoir.

Thus, an industry bias has developed toward the simple adjustment of the inker filament in relation to the movement of the plunger arm as provided by prior art axial movement systems. According to the present invention, adjustment of the angle pin 18 is effected by simply screwing the pin 18 into small threads within the plunger 17, as shown in FIGS. 3 and 4.

A person understanding the present invention may conceive of other variations or modifications therein. All such variations and modifications are believed to be within the sphere and scope of the present invention as defined by the claims appended hereto.

We claim:

1. In a probe instrument provided with a movable probe test head for testing circuits on a semiconductor wafer and in response generating control signals indicative of defective ones of said circuits, a low profile inker for marking said defective circuits, comprised of:
   (a) a support arm connected to said probe instrument beneath said test head,
   (b) an inker reservoir rigidly mounted on said support arm for storing a quantity of marking liquid, including a substantially vertical inker filament for forcing said liquid from said reservoir,
   (c) solenoid operated plunger means mounted on said support arm parallel to said reservoir, for receiving said control signals and in response moving in a substantially vertical axis,
   (d) a needle extending substantially vertically downward from said reservoir for directing said liquid forced from said reservoir onto said defective circuits, and
   (e) parallel activator means connecting said plunger means and said inker filament for translating vertical movement of said plunger means into parallel movement of said inker filament thereby forcing said liquid onto said defective circuits while maintaining the reservoir and needle fixed to the support arm.

2. A low profile inker as defined in claim 1, wherein said support arm is connected to said probe instrument by means of a clip.

3. A low profile inker as defined in claim 2, wherein said solenoid operated plunger means is connected to said support arm by means of a bracket secured thereto by a pair of bolts.

4. A low profile inker as defined in claim 1, wherein said parallel activator means is comprised of an angle pin attached at one end via a threaded connection to said plunger means and at the other end via a ball-and-socket connection to said inker filament.

5. A low profile inker as defined in claim 1, wherein said reservoir is secured to said support arm by means of clip support.

6. A low profile inker as defined in claim 1, wherein said solenoid operated plunger means is further comprised of a solenoid coil connected via a pair of control leads to said test head for receiving said control signals, an electromagnetically actuated plunger arm disposed within said solenoid coil, said plunger arm being urged within said coil upon receipt of said control signals by said coil, and a coil spring for urging said plunger arm into an extended position outside of said solenoid coil.

7. A low profile inker as defined in claim 2, wherein said parallel activator means is comprised of an angle pin attached at one end via a threaded connection to said plunger means and at the other end via a ball-and-socket connection to said inker filament.

8. A low profile inker as defined in claim 2, wherein said reservoir is secured to said support arm by mean of clip support.

9. A low profile inker as defined in claim 2, wherein said solenoid operated plunger means is further comprised of a solenoid coil connected via a pair of control leads to said test head for receiving said control signals, an electromagnetically actuated plunger arm disposed within said solenoid coil, said plunger arm being urged within said coil upon receipt of said control signals by said coil, and a coil spring for urging said plunger arm into an extended position outside of said solenoid coil.

10. A low profile inker as defined in claim 3, wherein said parallel activator means is comprised of an angle pin attached at one end via a threaded connection to said plunger means and at the other end via a ball-and-socket connection to said inker filament.

11. A low profile inker as defined in claim 3, wherein said reservoir is secured to said support arm by means of clip support.

12. A low profile inker as defined in claim 3, wherein said solenoid operated plunger means is further comprised of a solenoid coil connected via a pair of control leads to said test head for receiving said control signals, an electromagnetically actuated plunger arm disposed within said solenoid coil, said plunger arm being urged within said coil upon receipt of said control signals by said coil, and a coil spring for urging said plunger arm into an extended position outside of said solenoid coil.

* * * * *